United States Patent
Jeong et al.

(10) Patent No.: US 9,680,047 B2
(45) Date of Patent: Jun. 13, 2017

(54) METHOD FOR MANUFACTURING POLYCRYSTALLINE SILICON THIN-FILM SOLAR CELLS BY MEANS METHOD FOR CRYSTALLIZING LARGE-AREA AMORPHOUS SILICON THIN FILM USING LINEAR ELECTRON BEAM

(71) Applicant: KOREA INSTITUTE OF INDUSTRIAL TECHNOLOGY, Chungcheongnam-do (KR)

(72) Inventors: Chae Hwan Jeong, Gwangju (KR); Sun Hwa Lee, Gwangju (KR); Sang Ryu, Gwangju (KR); Ho Sung Kim, Gyeonggi-do (KR); Seong Jae Boo, Gyeonggi-do (KR)

(73) Assignee: KOREA INSTITUTE OF INDUSTRIAL TECHNOLOGY, Chungcheongnam-do (KR)

( * ) Notice: Subject to any disclaimer, the term of this patent is extended or adjusted under 35 U.S.C. 154(b) by 0 days.

(21) Appl. No.: 14/437,087

(22) PCT Filed: Dec. 18, 2012

(86) PCT No.: PCT/KR2012/011060
§ 371 (c)(1),
(2) Date: Apr. 20, 2015

(87) PCT Pub. No.: WO2014/065464
PCT Pub. Date: May 1, 2014

(65) Prior Publication Data
US 2015/0280048 A1    Oct. 1, 2015

(30) Foreign Application Priority Data

Oct. 25, 2012  (KR) .................. 10-2012-0119310
Oct. 25, 2012  (KR) .................. 10-2012-0119312
Oct. 30, 2012  (KR) .................. 10-2012-0121419

(51) Int. Cl.
*H01L 31/18*     (2006.01)
*H01L 31/068*    (2012.01)
*C23C 14/58*     (2006.01)

(52) U.S. Cl.
CPC ........ *H01L 31/182* (2013.01); *C23C 14/5806* (2013.01); *H01L 31/068* (2013.01);
(Continued)

(58) Field of Classification Search
CPC .................................................. H01L 31/1872
See application file for complete search history.

(56) References Cited

U.S. PATENT DOCUMENTS 7,091,411 B2 *  8/2006  Falk ................ H01L 31/022466
                                                    136/258
2008/0176357 A1  7/2008  Huet et al.
2011/0039034 A1  2/2011  Maynard et al.

FOREIGN PATENT DOCUMENTS

KR    10-2011-0093046    8/2011
KR    10-2011-0124962    11/2011
(Continued)

OTHER PUBLICATIONS

Jeong et al., KR 10-2011-0095730 (English Translation).*
International Search Report mailed Jul. 12, 20123 for PCT/KR2012/011060.

*Primary Examiner* — Yu-Hsi D Sun

(57) ABSTRACT

One embodiment of the present invention relates to a method of manufacturing polycrystalline silicon thin-film solar cell by a method of crystallizing a large-area amorphous silicon thin film using a linear electron beam, and the technical problem to be solved is to crystallize an amorphous silicon thin film, which is formed on a low-priced
(Continued)

substrate, by means of an electron beam so as for same to easily be of high quality by having high crystallization yield and to be processed at a low temperature. To this end, one embodiment of the present invention provides a method of manufacturing polycrystalline silicon thin-film solar cell by means of a method for crystallizing a large-area amorphous silicon thin film using a linear electron beam, the method comprising: a substrate preparation step for preparing a substrate; a type 1+ amorphous silicon layer deposition step for forming a type 1+ amorphous silicon layer on the substrate; a type 1 amorphous silicon layer deposition step for forming a type 1 amorphous silicon layer on the type 1+ amorphous silicon layer; an absorption layer formation step for forming an absorption layer by radiating a linear electron beam to the type 1 amorphous silicon layer and thus crystallizing the type 1 amorphous layer and the type 1+ amorphous silicon layer; a type 2 amorphous silicon layer deposition step for forming a type 2 amorphous silicon layer on the absorption layer; and an emitter layer formation step for forming an emitter layer by radiating a linear electron beam to the type 2 amorphous silicon layer and thus crystallizing the type 2 amorphous silicon layer, wherein the linear electron beam is radiated from above type 1 and type 2 amorphous silicon layers in a linear scanning manner in which to reciprocate in a predetermined area.

18 Claims, 12 Drawing Sheets

(52) U.S. Cl.
CPC ........ *H01L 31/1872* (2013.01); *Y02E 10/547* (2013.01); *Y02P 70/521* (2015.11)

(56)          References Cited

FOREIGN PATENT DOCUMENTS

KR        10-1194057        10/2012
WO        WO 81-00789       3/1981

* cited by examiner

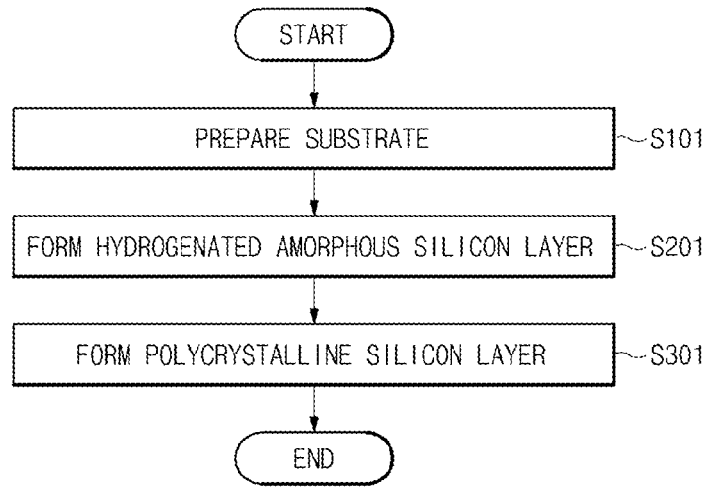
FIG. 12
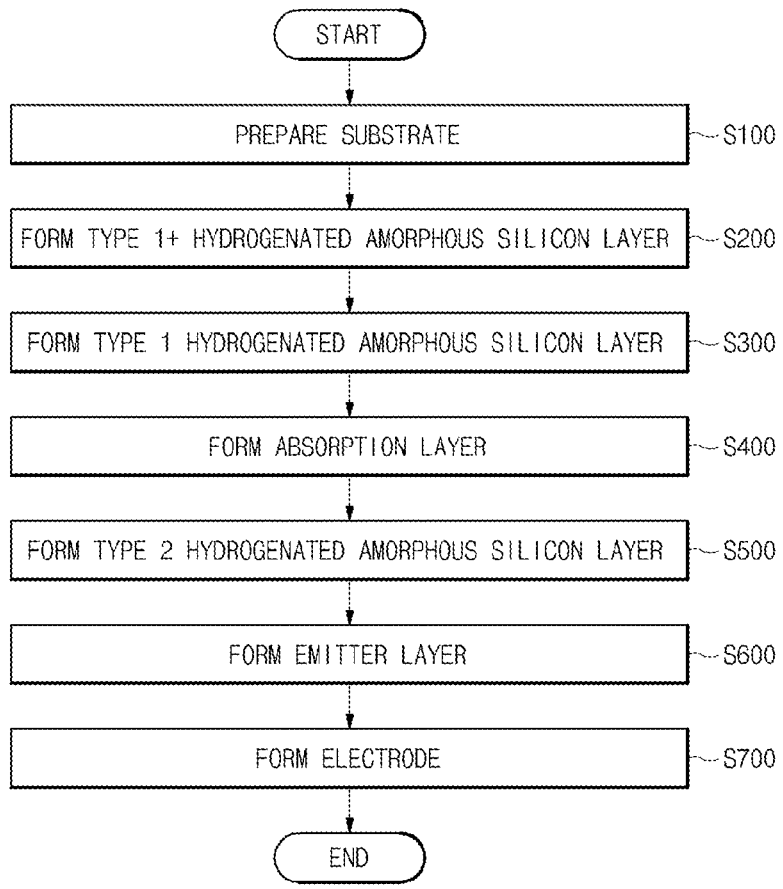
FIG. 13
FIG. 14A
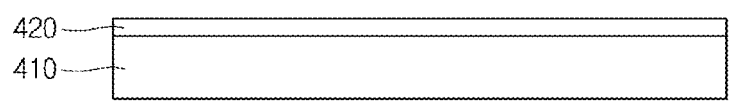

METHOD FOR MANUFACTURING POLYCRYSTALLINE SILICON THIN-FILM SOLAR CELLS BY MEANS METHOD FOR CRYSTALLIZING LARGE-AREA AMORPHOUS SILICON THIN FILM USING LINEAR ELECTRON BEAM

This application claims the priority of Korean Patent Application Nos. 10-2012-0119310, 10-2012-0119312, and 10-2012-0121419, filed on Oct. 25, 2012, Oct. 25, 2012, and Oct. 30, 2012 in the KIPO (Korean Intellectual Property Office), the disclosure of which is incorporated herein entirely by reference. Further, this application is the National Stage application of International Application No. PCT/KR2012/011060, filed Dec. 18, 2012, which designates the United States and was published in Korean. Each of these applications is hereby incorporated by reference in their entirety into the present application.

TECHNICAL FIELD

Embodiments relate to a method of manufacturing a polycrystalline silicon thin film solar cell by a method of crystallizing a large-area amorphous silicon thin film using a linear electron beam.

BACKGROUND ART

In general, a core technology of a solar cell using a bulk-structured polycrystalline silicon thin film is to form a polycrystalline silicon thin film on a glass substrate, i.e., a low-cost substrate.

Since it may be impossible to form a polycrystalline silicon thin film on an amorphous glass substrate in terms of processing, an amorphous silicon thin film is formed. Then, a polycrystalline silicon thin film is formed by performing a crystallization process as a post process.

As a typical crystallization method, there is a method of using heat. However, since amorphous silicon is crystallized at a higher temperature than a melting point of a glass substrate, the above method has been regarded as an impossible method.

Recently, research into various crystallization methods has been conducted mainly in industrialized countries, and metal induced crystallization (MIC), laser crystallization (LC), and joule induced crystallization (JIC) have typically been known.

With respect to MIC, as a method of crystallization while stacking metal (aluminum (Al), nickel (Ni), and gold (Au)) and amorphous silicon and applying heat below the melting point of a glass substrate, it has a limitation in application to a high-quality solar cell due to metal residues.

With respect to JIC, as a method of crystallization by forming an electrode on an amorphous silicon thin film and temporarily applying an induced current, since the adhesiveness of the thin film may be weak and a phenomenon of peeling off the thin film may be severe, reproducibility may be reduced.

With respect to LC, it is a reliable method of providing a high-quality product by crystallization. However, because a substrate is scanned with a laser beam, a shot mark phenomenon, which is caused by the non-uniformity of energy generated during the LC, may occur, it may take a long time, and cost may be basically high.

DISCLOSURE OF THE INVENTION

Technical Problem

An aspect of the present invention provides a method of manufacturing a polycrystalline silicon thin film solar cell by a method of crystallizing a large-area amorphous silicon thin film using a linear electron beam, in which since an amorphous silicon thin film formed on a low-cost substrate is crystallized with an electron beam, a high-quality product may be easily provided due to a high crystallization fraction and low-temperature processing is possible.

Another aspect of the present invention provides a method of manufacturing a polycrystalline silicon thin film solar cell by a method of crystallizing a large-area amorphous silicon thin film using a linear electron beam, in which a large-area polycrystalline silicon thin film having a high crystallization fraction and a large grain size may be manufactured within the shortest time possible by crystallizing an amorphous silicon thin film, which is deposited by a physical vapor deposition method capable of manufacturing a large-area solar cell because high-rate deposition of amorphous silicon is possible, with an electron beam.

Another aspect of the present invention provides a method of manufacturing a polycrystalline silicon thin film solar cell by a method of crystallizing a large-area amorphous silicon thin film using a linear electron beam, in which since a boron-doped amorphous silicon layer is formed by using a plasma enhanced chemical vapor deposition method and is then crystallized with an electron beam, a high-quality product may be easily provided due to a high crystallization fraction.

Technical Solution

According to at least one of embodiments, a method of manufacturing a polycrystalline silicon thin film solar cell by a method of crystallizing a large-area amorphous silicon thin film using a linear electron beam includes: preparing a substrate in which the substrate is prepared; depositing a type 1+ amorphous silicon layer in which the type 1+ amorphous silicon layer is formed on the substrate; depositing a type 1 amorphous silicon layer in which the type 1 amorphous silicon layer is formed on the type 1+ amorphous silicon layer; forming an absorption layer in which the absorption layer is formed by crystallizing the type 1 amorphous silicon layer and the type 1+ amorphous silicon layer by irradiating the type 1 amorphous silicon layer with a linear electron beam; depositing a type 2 amorphous silicon layer in which the type 2 amorphous silicon layer is formed on the absorption layer; and forming an emitter layer in which the emitter layer is formed by crystallizing the type 2 amorphous silicon layer by irradiating the type 2 amorphous silicon layer with a linear electron beam, wherein the linear electron beam is irradiated in a linear scan mode in which the linear electron beam is reciprocated within a predetermined distance on the type 1 and type 2 amorphous silicon layers.

In the preparing of the substrate, the substrate may be a glass substrate or a metal foil.

The type 1 and type 2 amorphous silicon layers may be formed by plasma enhanced chemical vapor deposition (PECVD).

The linear electron beam may have an energy of 1.5 keV to 5 keV and an irradiation time of 30 seconds to 120 seconds.

The type 1 and type 2 amorphous silicon layers may be formed by an e-beam evaporator.

The linear electron beam may have an energy of 2.5 keV to 5 keV and an irradiation time of 25 seconds to 200 seconds.

The type 1 and type 2 amorphous silicon layers may be formed by a physical vapor deposition method.

The linear electron beam may have an intensity of 4.0 keV, a radio frequency (RF) power of 320 W, an irradiation time of 100 seconds, and a scan rate of 10 cm/min.

In the forming of the absorption layer and the forming of the emitter layer, a process pressure may be $3 \times 10^{-4}$ torr and a process time may be 25 seconds to 200 seconds.

A process pressure and a deposition rate of the physical vapor deposition method may be $1.0 \times 10-7$ Torr and 10 Å/s, respectively.

The type 1+ amorphous silicon layer may be formed to a thickness of 200 nm, and the type 1 amorphous silicon layer may be formed to a thickness of 1 μm to 1.5 μm.

The type 2 amorphous silicon layer may be formed to a thickness of 100 nm.

A grain size along a direction horizontal to the absorption layer may be 200 nm.

The linear electron beam may include electrons that are separated from argon ions by a plasma generated from argon gas which is injected at 50 sccm.

According to another embodiment, a method of manufacturing a polycrystalline silicon thin film solar cell by a method of crystallizing a large-area amorphous silicon thin film using a linear electron beam includes: preparing a substrate in which the substrate is prepared; depositing a type 1+ hydrogenated amorphous silicon layer in which the type 1+ hydrogenated amorphous silicon layer is deposited on the substrate by a plasma enhanced chemical vapor deposition method; depositing a type 1 hydrogenated amorphous silicon layer in which the type 1 hydrogenated amorphous silicon layer is deposited on the type 1+ hydrogenated amorphous silicon layer by a plasma enhanced chemical vapor deposition method; forming an absorption layer in which the absorption layer is formed by crystallizing the type 1 hydrogenated amorphous silicon layer and the type 1+ hydrogenated amorphous silicon layer by irradiating the type 1 hydrogenated amorphous silicon layer with a linear electron beam; depositing a type 2 hydrogenated amorphous silicon layer in which the type 2 hydrogenated amorphous silicon layer is deposited on the absorption layer by a plasma enhanced chemical vapor deposition method; and forming an emitter layer in which the emitter layer is formed by crystallizing the type 2 hydrogenated amorphous silicon layer by irradiating the type 2 hydrogenated amorphous silicon layer with a linear electron beam, wherein the linear electron beam is irradiated in a linear scan mode in which the linear electron beam is reciprocated within a predetermined distance on the type 1 and type 2 hydrogenated amorphous silicon layers.

The linear electron beam may include electrons that are separated from argon ions by a plasma generated from argon gas.

The substrate may be a glass substrate or a metal foil.

The hydrogenated amorphous silicon layer may be doped with boron.

A doping concentration of boron in the hydrogenated amorphous silicon layer may be controlled by the plasma enhanced chemical vapor deposition method.

The hydrogenated amorphous silicon layer may be formed at a process pressure of 100 mtorr to 500 mtorr, a process power of 25 W to 100 W, and a process temperature of 150° C. to 300° C.

The linear electron beam may have an energy of 1.5 keV to 5 keV.

An irradiation time of the linear electron beam may be in a range of 30 seconds to 120 seconds.

The linear electron beam may be irradiated after the hydrogenated amorphous silicon layer is completely formed on a surface of the substrate.

Advantageous Effects

Since a method of manufacturing a polycrystalline silicon thin film solar cell by a method of crystallizing a large-area amorphous silicon thin film using a linear electron beam according to an embodiment of the present disclosure may provide an amorphous silicon thin film having a higher crystallization fraction than the related art, a high-quality solar cell may be easily provided.

According to an embodiment of the present disclosure, since a low-cost substrate, such as a glass substrate or a metal foil, may be used, low-temperature processing may be possible to minimize a degradation phenomenon and reduce manufacturing costs of a solar cell.

Also, according to an embodiment of the present disclosure, an amorphous thin film may be crystallized in a short period of time, and a large-area high-quality polycrystalline silicon thin film having a high crystallization fraction and a large grain size may be provided.

Furthermore, according to an embodiment of the present disclosure, since a boron-doped amorphous silicon layer is formed by using a plasma enhanced chemical vapor deposition method and is then crystallized with an electron beam, a high-quality polycrystalline silicon thin film solar cell may be easily provided due to a high crystallization fraction.

BRIEF DESCRIPTION OF THE DRAWINGS

FIG. 12 is a flowchart illustrating a method of crystallizing a large-area hydrogenated amorphous silicon thin film, which is formed by a plasma enhanced chemical vapor deposition method, using a linear electron beam according to another embodiment of the present disclosure;

FIG. 13 is a flowchart illustrating a method of manufacturing a polycrystalline silicon thin film solar cell which includes a method of crystallizing a large-area hydrogenated amorphous silicon thin film, which is formed by a plasma enhanced chemical vapor deposition method, using a linear electron beam according to another embodiment of the present disclosure;

FIGS. 14A to 14G sequentially illustrate the method of manufacturing a polycrystalline silicon thin film solar cell which includes a method of crystallizing a large-area hydrogenated amorphous silicon thin film, which is formed by a plasma enhanced chemical vapor deposition method, using a linear electron beam according to the another embodiment of the present disclosure.

MODE FOR CARRYING OUT THE INVENTION

Example embodiments will now be described more fully hereinafter with reference to the accompanying drawings to fully explain the present disclosure in such a manner that it may easily be carried out by a person with ordinary skill in the art to which the present disclosure pertains.

Figure 1:
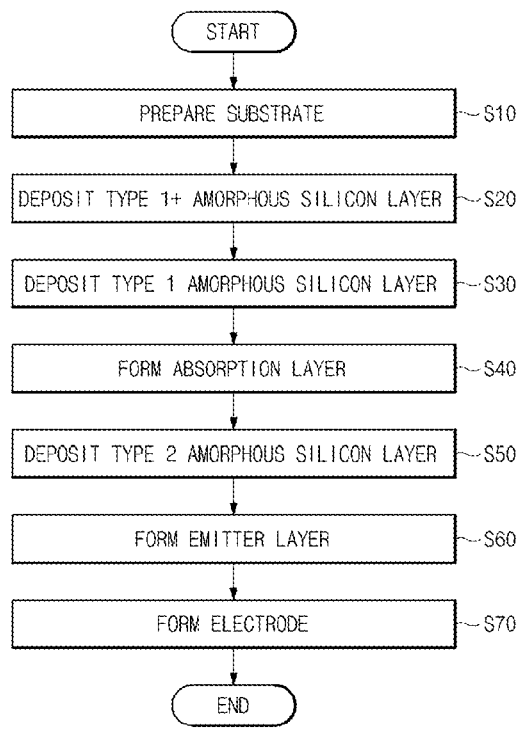
FIG. 1 is a flowchart illustrating a method of manufacturing a polycrystalline silicon thin film solar cell by a method of crystallizing a large-area amorphous silicon thin film using a linear electron beam according to an embodiment of the present disclosure.

FIG. 1 is a flowchart illustrating a method of manufacturing a polycrystalline silicon thin film solar cell by a method of crystallizing a large-area amorphous silicon thin film using a linear electron beam according to an embodiment of the present disclosure.

As illustrated in FIG. 1, the method of manufacturing a polycrystalline silicon thin film solar cell by a crystallization method of a large-area amorphous silicon thin film using a linear electron beam according to the embodiment of the present disclosure may include a substrate preparing step S10, a type 1+ amorphous silicon layer depositing step S20, a type 1 amorphous silicon layer depositing step S30, an absorption layer forming step S40, a type 2 amorphous silicon layer depositing step S50, an emitter layer forming step S60, and an electrode forming step S70.

FIGS. 2A to 2G sequentially illustrate the method of manufacturing a polycrystalline silicon thin film solar cell by a method of crystallizing a large-area amorphous silicon thin film using a linear electron beam according to the embodiment of the present disclosure.

In the present embodiment, the expression "type 1" denotes a P-type and the expression "type 2" denotes an N-type. Conversely, the type 1 may denote an N-type, and the type 2 may denote a P-type.

Also, type 1 or type 2 marked with "+" denotes a degree to which a P-type or N-type dopant is doped, and it denotes that the type 1 or type 2 marked with "+" is doped with more dopants than type 1 or type 2 without the mark "+".

Figure 2A:
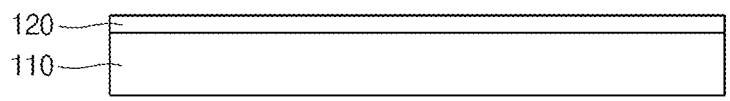
FIGS. 2A to 2G sequentially illustrate the method of manufacturing a polycrystalline silicon thin film solar cell by a method of crystallizing a large-area amorphous silicon thin film using a linear electron beam according to the embodiment of the present disclosure.

As illustrated in FIG. 2A, in the substrate preparing step S10, an approximately flat substrate is prepared. That is, such a substrate may be a low-cost substrate, e.g., a glass substrate or a metal foil. For example, in a case where the substrate 110 is formed of a glass substrate, Corning 1737F glass, in which a softening point, an annealing point, and a strain point, which directly affect processing, respectively are 975° C., 721° C., and 666° C. and are better than those of other glasses, may be used as the substrate 110. Also, in a case where the substrate 110 is formed of a metal foil substrate, an insulation layer (not shown) may be included between the substrate 110 and a type 1+ amorphous silicon layer 130 to insulate from the type 1+ amorphous silicon layer 130 that is disposed on the substrate 110. Hereinafter, in the present embodiment, that the substrate 110 is formed of a metal foil will be described as an example.

In addition, a cleaning process may be performed on the substrate 110. For example, ultrasonically cleaning the substrate 110 in an acetone solution, an isopropyl alcohol (IPA) solution, and a methanol solution respectively for 10 minutes, then rinsing 5 times with deionized (DI) water, and subsequently $N_2$ blowing may be preformed.

Also, a buffer layer 120 (oxide layer or nitride layer) may be formed on the substrate 110 in advance, and the buffer layer 120 functions to allow an amorphous silicon layer to be better deposited on the substrate 110 and to prevent the movement of contaminants from the substrate 110 to an amorphous silicon layer or a polycrystalline silicon layer. In some cases, the buffer layer 120 may not be formed.

Although not illustrated in FIG. 2A, a protective layer may be formed between the substrate 110 and the buffer layer 120 to prevent heat transfer from the buffer layer 120 to the substrate 110, and the protective layer may include $SiO_2$. A method of forming the protective layer is not particularly limited, and for example, a sputter and an evaporator may be used.

Figure 2B:
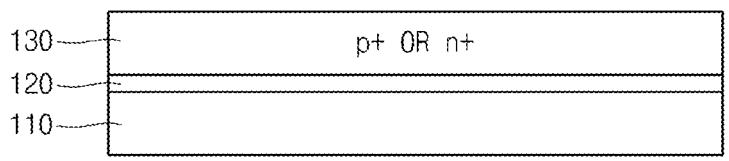

As illustrated in FIG. 2B, in the type 1+ amorphous silicon layer depositing step S20, the type 1+ amorphous silicon layer 130, for example, is deposited on the substrate 110 or the buffer layer 120 to a thickness of about 200 nm in a vertical direction by plasma enhanced chemical vapor deposition (PECVD). Herein, the type 1+ amorphous silicon layer 130 may be deposited by a sputter or an evaporator in addition to the PECVD, and the deposition method is not limited in the present disclosure. The type 1+ amorphous silicon layer 130 is doped with type 1 in a high concentration to function as a back surface field.

Figure 2C:
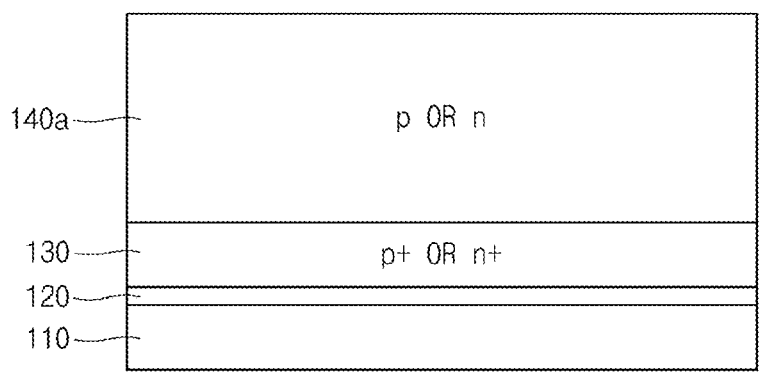

As illustrated in FIG. 2C, in the type 1 amorphous silicon layer depositing step S30, a type 1 amorphous silicon layer 140a is deposited on the type 1+ amorphous silicon layer 130. That is, the type 1 amorphous silicon layer 140a, for example, is deposited on the type 1+ amorphous silicon layer 130 to a thickness of about 1 μm to about 1.5 μm in a vertical direction by PECVD or an e-beam evaporator. In the present disclosure, the deposition method of the type 1 amorphous silicon layer 140a is not limited.

Figure 2D:
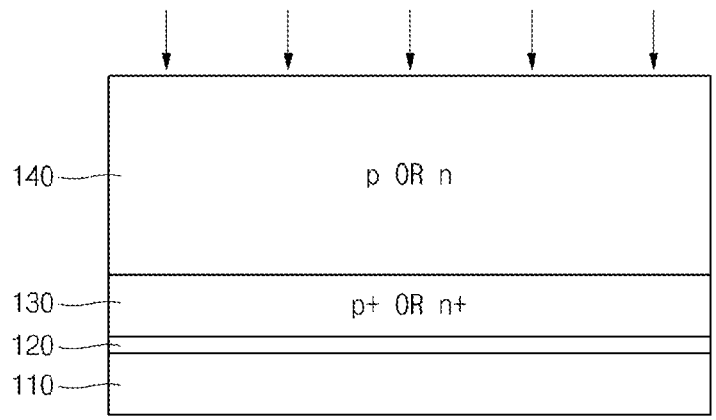

As illustrated in FIG. 2D, in the absorption layer forming step S40, an absorption layer 140 is formed by crystallizing the type 1+ amorphous silicon layer 130 and the type 1 amorphous silicon layer 140a into polycrystalline silicon by irradiating the type 1 amorphous silicon layer 140a with a linear electron beam. The linear electron beam is not obtained by accelerating thermal electrons, which are conventionally generated by applying a current to a filament, by a magnetic field. That is, argon gas is separated into argon ions and electrons by the formation of a high-density plasma, and the linear electron beam is composed of only the electrons among the separated argon ions and electrons.

Herein, with respect to the linear electron beam obtained from thermal electrons, as electrons generated by applying a current to a filament such as tungsten, the concentration or number of electrons may vary according to the degradation of the filament and a high-density electron cluster may be difficult to be obtained. However, as a method of using a plasma, a capacitively coupled plasma (CCP) or an inductively coupled plasma (ICP) is to obtain an electron beam by separating inert gas, such as argon, into argon ions and electrons using an electric field, wherein a high-density electron concentration obtained by the ICP is about 100 times higher than that by the CCP. Thus, an electron beam obtained from the ICP, for example, is used in which the periodic replacement time thereof is longer than that of the case of using thermal electrons from the filament and the intensity of the electron beam may be easily adjusted by forming a high-density electron concentration.

Furthermore, since the linear electron beam may be operated in a linear scan mode by using a grid lens instead of a spot-scanning mode, the linear electron beam may rapidly scan the type 1 amorphous silicon layer 140a at a rate of about 10 cm/min.

Therefore, the linear electron beam irradiation method according to the present disclosure is suitable for manufacturing a large-area solar cell.

In a case where the type 1 amorphous silicon layer 140a is deposited by PECVD in the type 1 amorphous silicon layer depositing step S30, it is appropriate for the linear electron beam to have an energy of 1.5 keV to 5 keV. In the case that the energy of the linear electron beam is less than 1.5 keV, a crystallization rate and a crystallization fraction may be relatively low, and in the case in which the energy of the linear electron beam is greater than 5 keV, a surface of the type 1 amorphous silicon layer 140a may be removed by etching. In this case, an irradiation time of the linear electron beam may be in a range of 30 seconds to 120 seconds.

Also, in a case where the type 1 amorphous silicon layer 140a is deposited using an e-beam evaporator in the type 1 amorphous silicon layer depositing step S30, it is appropriate for the linear electron beam to have an energy of 2.5 keV to 5 keV. In the case that the energy of the linear electron beam is less than 2.5 keV, the crystallization rate and crystallization fraction may be relatively low, and in the case in which the energy of the linear electron beam is greater than 5 keV, the surface of the type 1 amorphous silicon layer 140a may be removed by etching. In this case, the irradiation time of the linear electron beam may be in a range of 25 seconds to 200 seconds.

Figure 2E:
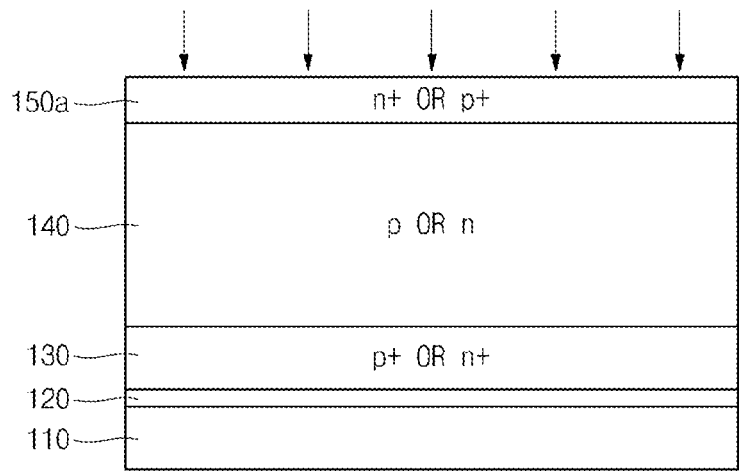

As illustrated in FIG. 2E, in the type 2 amorphous silicon layer depositing step S50, a second amorphous silicon layer 150a having a thickness of about 100 nm in a direction perpendicular to the crystallized absorption layer 140 is deposited in the same manner as described above. That is, the type 2 amorphous silicon layer 150a having a conductive type opposite to that of the type 1+ amorphous silicon layer 130 and the type 1 amorphous silicon layer 140a is deposited on the absorption layer 140 by physical vapor deposition (PVD), e.g., PECVD or an e-beam evaporator. For example, in a case where an e-beam evaporator is used, the type 2 amorphous silicon layer 150a may be deposited at room temperature and a working pressure of about $1.2 \times 10^{-5}$ Torr for a deposition time of about 200 seconds by using a boron source (about 99.999%) in an effusion cell and a silicon source (about 99.999%) in a crucible.

Herein, only power of the electron beam may be adjusted to obtain a desired deposition rate by using the above process conditions, and the higher the power of the electron beam is, the faster the deposition rate is. However, in a case where the deposition is performed at a high rate of 0.5 μm/min or more, a peeling-off phenomenon may occur.

Figure 2F:
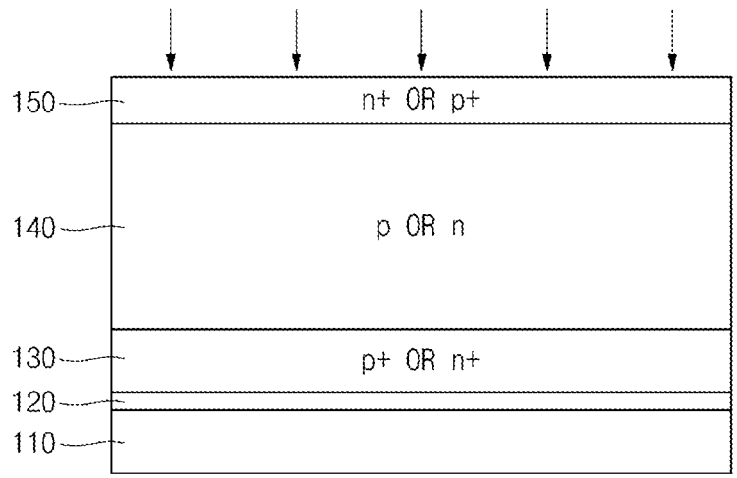

As illustrated in FIG. 2F, in the emitter layer forming step S60, an emitter layer 150 is formed by crystallizing the type 2 amorphous silicon layer 150a into polycrystalline silicon by irradiating the rapidly deposited type 2 amorphous silicon layer 150a with a linear electron beam. As described above, argon gas is separated into argon ions and electrons by the formation of a high-density plasma, and the linear electron beam may be composed of only the electrons among the separated argon ions and electrons. In addition, since the linear electron beam may be operated in a linear scan mode by using a grid lens instead of a spot-scanning mode, the linear electron beam may rapidly scan the type 2 amorphous silicon layer 150a at a rate of about 10 cm/min.

Thus, the linear electron beam irradiation method according to the present disclosure is suitable for obtaining a large-area solar cell.

In a case where the type 2 amorphous silicon layer 150a is deposited by PECVD in the type 2 amorphous silicon layer depositing step S50, it is appropriate for the linear electron beam to have an energy of 1.5 keV to 5 keV. In the case that the energy of the linear electron beam is less than 1.5 keV, the crystallization rate and crystallization fraction may be relatively low, and in the case in which the energy of the linear electron beam is greater than 5 keV, a surface of the type 2 amorphous silicon layer 150a may be removed by etching. In this case, the irradiation time of the linear electron beam may be in a range of 30 seconds to 120 seconds.

Also, in a case where the type 2 amorphous silicon layer 150a is deposited using an e-beam evaporator in the type 2 amorphous silicon layer depositing step S50, it is appropriate for the linear electron beam to have an energy of 2.5 keV to 5 keV. In the case that the energy of the linear electron beam is less than 2.5 keV, the crystallization rate and crystallization fraction may be relatively low, and in the case in which the energy of the linear electron beam is greater than 5 keV, the surface of the type 2 amorphous silicon layer 150a may be removed by etching. In this case, the irradiation time of the linear electron beam may be in a range of 25 seconds to 200 seconds.

Figure 2G:
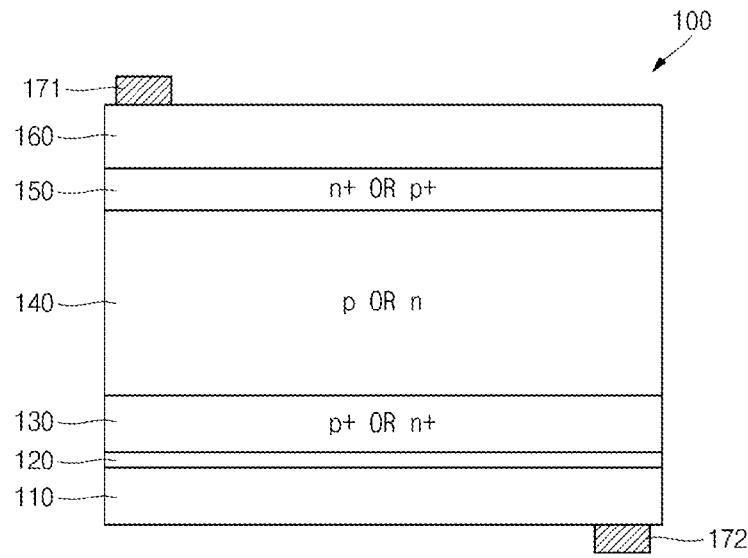

As illustrated in FIG. 2G, in the electrode forming step S70, a solar cell is completed by forming a front electrode 171 to be in contact with a portion of the emitter layer 150 and forming a rear electrode 172 to be in contact with the substrate 110. Herein, a transparent conductive layer 160 or an anti-reflective layer (not shown) may be further formed on the emitter layer 150.

Figure 3:
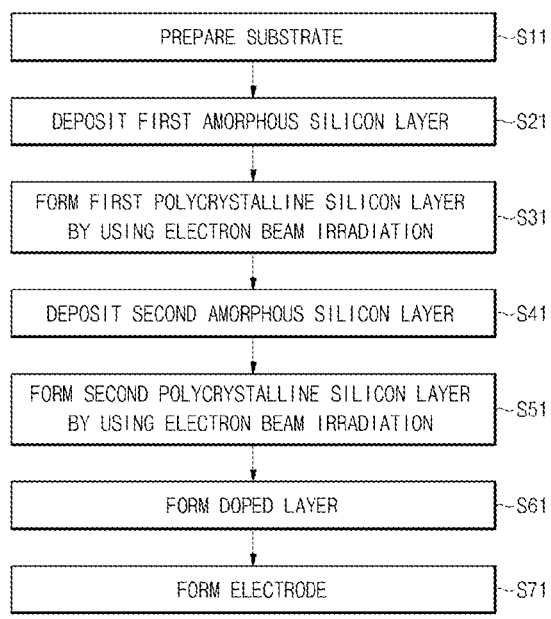
FIG. 3 is a flowchart illustrating a method of manufacturing a polycrystalline silicon thin film solar cell by a method of crystallizing a large-area amorphous silicon thin film, which is formed by using a physical vapor deposition method, using a linear electron beam according to another embodiment of the present disclosure.

FIG. 3 is a flowchart illustrating a method of manufacturing a polycrystalline silicon thin film solar cell by a method of crystallizing a large-area amorphous silicon thin film, which is formed by using a physical vapor deposition method, using a linear electron beam according to another embodiment of the present disclosure.

As illustrated in FIG. 3, the method of manufacturing a polycrystalline silicon thin film solar cell by a method of crystallizing a large-area amorphous silicon thin film, which is formed by using a physical vapor deposition method, using a linear electron beam according to the another embodiment of the present disclosure may include a substrate preparing step S11 in which a substrate 210 is prepared; a first amorphous silicon layer depositing step S21 in which a first amorphous silicon layer is deposited on the substrate 210 by a physical vapor deposition method; a first polycrystalline silicon layer forming step S31 in which a first polycrystalline silicon layer is formed by crystallizing the first amorphous silicon layer by irradiating the first amorphous silicon layer with an electron beam; a second amorphous silicon layer depositing step S41 in which a second amorphous silicon layer is deposited on the first polycrystalline silicon layer by a physical vapor deposition method; and a second polycrystalline silicon layer forming step S51 in which a second polycrystalline silicon layer is formed by crystallizing the second amorphous silicon layer by irradiating the second amorphous silicon layer with an electron beam, wherein the electron beam is irradiated in a linear scan mode in which the electron beam is reciprocated within a predetermined distance on the first and second amorphous silicon layers.

FIGS. 4A to 4G sequentially illustrate the method of manufacturing a polycrystalline silicon thin film solar cell by a method of crystallizing a large-area amorphous silicon thin film, which is formed by using a physical vapor deposition method, using a linear electron beam according to the another embodiment of the present disclosure.

In the present embodiment, a first amorphous silicon layer 220*a* is a P-type layer and a second amorphous silicon layer 230*a* is an N-type layer. Conversely, the first amorphous silicon layer 220*a* may be an N-type layer and the second amorphous silicon layer 230*a* may be a P-type layer. A P+ type or N+ type denotes a degree to which a P-type or N-type dopant is doped, and it denotes that the P type or N type marked with "+" is doped with more dopants than a P type or N type without the mark "+".

Figure 4A:
FIGS. 4A to 4G sequentially illustrate the method of manufacturing a polycrystalline silicon thin film solar cell by a method of crystallizing a large-area amorphous silicon thin film, which is formed by using a physical vapor deposition method, using a linear electron beam according to the another embodiment of the present disclosure.

As illustrated in FIG. 4A, in the substrate preparing step S11, the approximately flat substrate 210 having a size of 10 cm×10 cm is prepared. The substrate 210, for example, may be any one selected from glass, ceramic, polymer, metal, and equivalents thereof. However, in the present disclosure, a material of the substrate is not limited thereto. For example, the substrate 210 may be glass, wherein Corning glass, soda-lime glass, or Pyrex may be used. Specifically, Corning 1737F glass, in which a softening point, an annealing point, and a strain point, which directly affect processing, respectively are 975° C., 721° C., and 666° C. and are better than those of other glasses, may be used as the substrate 210.

In addition, a cleaning process may be performed on the substrate 210. For example, ultrasonically cleaning the substrate 210 in an acetone solution, an IPA solution, and a methanol solution respectively for 10 minutes, then rinsing 5 times with deionized (DI) water, and subsequently $N_2$ blowing may be preformed. Herein, a buffer layer 211 (oxide layer or nitride layer) may be formed on the substrate 210 in advance, and the buffer layer 211 functions to allow the first amorphous silicon layer 220*a* to be better deposited on the substrate 210 and to prevent the movement of contaminants from the substrate 210 to the first amorphous silicon layer 220*a* or a first polycrystalline silicon layer 220. In some cases, the buffer layer 211 may not be formed.

Figure 4B:
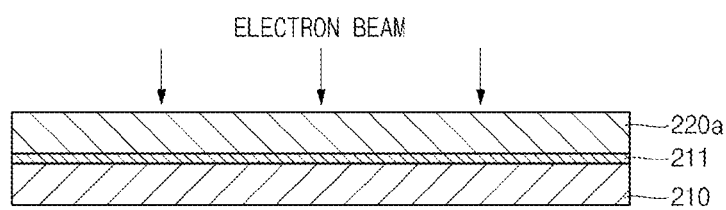

As illustrated in FIG. 4B, in the first amorphous silicon layer depositing step S21, the first amorphous silicon layer 220*a* is deposited on the substrate 210 or the buffer layer 211. That is, the first amorphous silicon layer 220*a* is deposited on the substrate 210 or the buffer layer 211 to a thickness of about 100 nm to about 350 nm in a vertical direction by PVD, for example, any one of sputtering, evaporation, and equivalent methods thereof.

For example, process conditions of the physical vapor deposition method, by which the first amorphous silicon layer 220*a* is deposited, may include a base pressure of about $1.0 \times 10^{-7}$ Torr, a deposition rate of about 10 Å/s, and a rotation speed of the substrate 210 of about 3 rpm.

Herein, only power of the electron beam may be adjusted to obtain a desired deposition rate by using the above process conditions, and the higher the power of the electron beam is, the faster the deposition rate is. However, in a case where the deposition is performed at a high rate of 10 Å/s or more, a peeling-off phenomenon may occur.

Figure 4C:
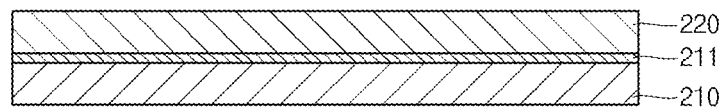

As illustrated in FIG. 4C, in the first polycrystalline silicon layer forming step S31, the first polycrystalline silicon layer 220 is formed by crystallizing the first amorphous silicon layer 220*a* into polycrystalline silicon by irradiating the first amorphous silicon layer 220*a* with a linear electron beam. The linear electron beam is not obtained by accelerating thermal electrons, which are conventionally generated by applying a current to a filament, by a magnetic field. That is, the linear electron beam is used in a method of irradiating with electrons which are separated from argon ions by the formation of a high-density plasma (Ar), and it may have effects of efficiently separating electrons/ions and obtaining a large-area solar cell by using a grid lens and electroplating.

Herein, with respect to a linear electron beam obtained from thermal electrons, as electrons generated by applying a current to a filament such as tungsten, the concentration or number of electrons may vary according to the degradation of the filament and a high-density electron cluster may be difficult to be obtained. However, as a method of using a plasma, a capacitively coupled plasma (CCP) or an inductively coupled plasma (ICP) is to obtain an electron beam by separating inert gas, such as argon, into argon ions and electrons using an electric field, wherein a high-density electron concentration obtained by the ICP is about 100 times higher than that by the CCP. Thus, an electron beam obtained from the ICP, for example, is used in which the periodic replacement time thereof is longer than that of the case of using thermal electrons from the filament and the intensity of the electron beam may be easily adjusted by forming a high-density electron concentration.

Furthermore, since the linear electron beam may be operated in a linear scan mode by using a grid lens instead of a spot-scanning mode, the linear electron beam may rapidly scan the first amorphous silicon layer 220*a* at a rate of about 10 cm/sec.

Therefore, the linear electron beam irradiation method according to the another embodiment of the present disclosure is suitable for manufacturing a large-area solar cell 200. Herein, it is appropriate for the linear electron beam to have an energy of 4 keV. In the case that the energy of the linear electron beam is less than 4 keV, crystallization may not occur, and in the case in which the energy of the linear electron beam is greater than 4 keV, a surface of the first amorphous silicon layer 220a may be removed by etching.

An irradiation time of the linear electron beam may be 100 seconds, radio frequency (RF) power may be 320 W, a process pressure of the first amorphous silicon layer forming step S21 may be $3 \times 10^{-4}$ torr, and a process temperature may be 500° C.

The large-area first polycrystalline silicon layer 220 overall having a high crystallization fraction and a large grain size may be formed in a short period of time by the linear electron beam irradiation.

Figure 4D:
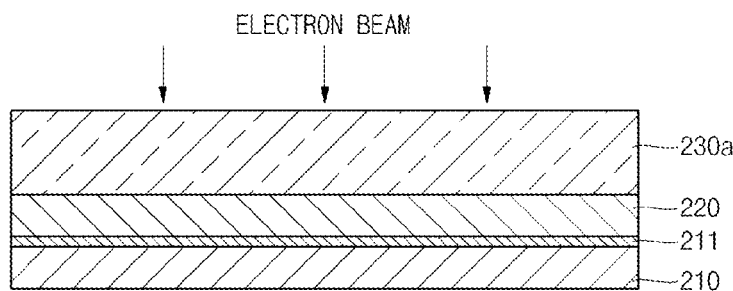

As illustrated in FIG. 4D, in the second amorphous silicon layer depositing step S41, the second amorphous silicon layer 230a is deposited on the first polycrystalline silicon layer 220 by the physical vapor deposition method.

Figure 4E:
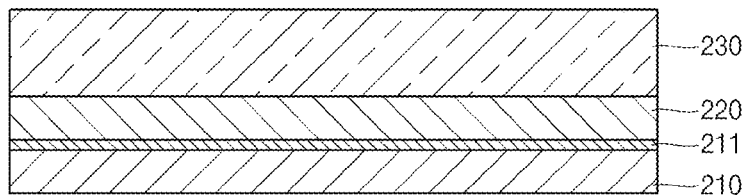

As illustrated in FIG. 4E, in the second polycrystalline silicon layer forming step S51, a second polycrystalline silicon layer 230 is formed by crystallizing the second amorphous silicon layer 230a into polycrystalline silicon by irradiating the rapidly deposited second amorphous silicon layer 230a with a linear electron beam.

An irradiation time of the linear electron beam may be 100 seconds, RF power may be 320 W, a process pressure in the second amorphous silicon layer forming step S41 may be $3 \times 10^{-4}$ torr, and a process temperature may be 500° C.

Figure 4F:
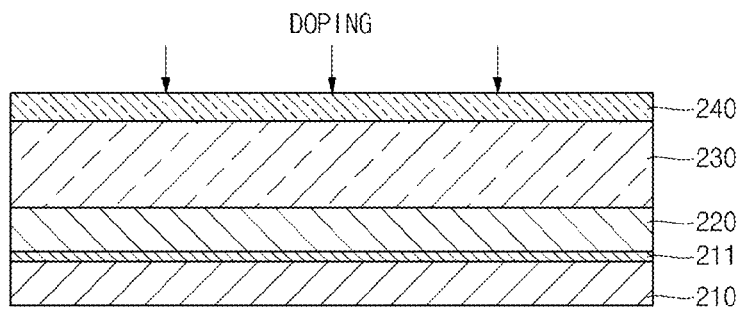

As illustrated in FIG. 4F, in the doping layer forming step S61, a doping layer 240 having a conductive type opposite to that of the first polycrystalline silicon layer 220 or the second polycrystalline silicon layer 230 is formed by ion-implanting an n+ type or p+ type impurity into the surface of the second polycrystalline silicon layer 230. The doping layer 240 may be formed to a thickness of about 100 nm to about 200 nm, but the present disclosure is not limited thereto. However, an amorphous silicon layer including an n+ type or p+ type impurity may be formed instead of the formation of the doping layer 240.

Figure 4G:
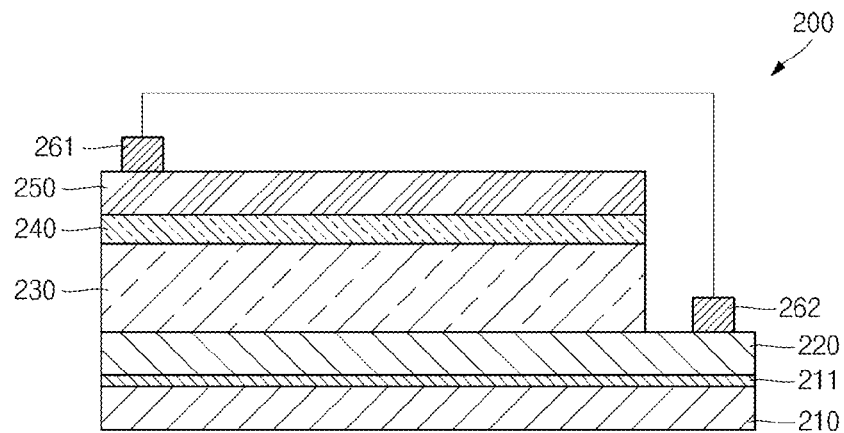

As illustrated in FIG. 4G, in the electrode forming step S71, the solar cell 200 is completed by forming electrodes 261 and 262 respectively on the first polycrystalline silicon layer 220 and the doping layer 240. Herein, a transparent conductive layer or an anti-reflective layer 250 may be further formed on the doping layer 240.

Figure 5:
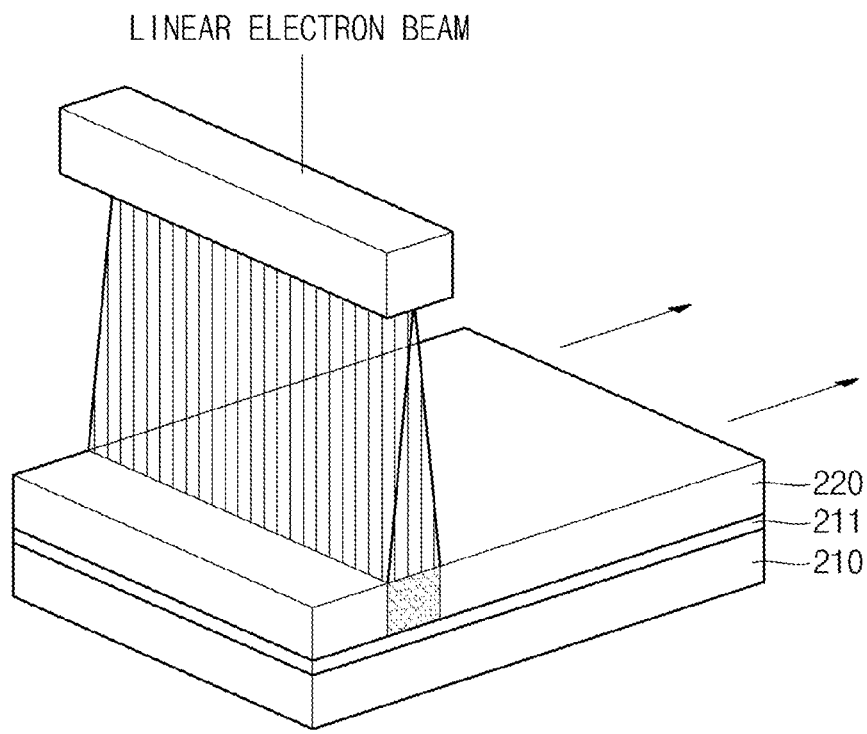
FIG. 5 illustrates a process of forming a polycrystalline silicon layer by irradiating an amorphous silicon layer with an electron beam in a linear scan mode.

FIG. 5 illustrates a process of forming a polycrystalline silicon layer by irradiating an amorphous silicon layer with an electron beam in a linear scan mode.

In order to form the polycrystalline silicon layers 220 and 230, the amorphous silicon layers 220a and 230a are formed on the substrate 210 having a size of 10 cm×10 cm by a physical vapor deposition method. Then, the amorphous silicon layers 220a and 230a are irradiated with a linear electron beam, which is reciprocated twice in about 100 seconds, under crystallization process conditions including a pressure of $3.0 \times 10^4$ torr, a RF power of 320 W, a linear electron beam intensity of 4 keV, and a scan rate of 10 cm/sec, and the results thereof are analyzed by methods that are illustrated in FIGS. 6 to 9.

Figure 6:
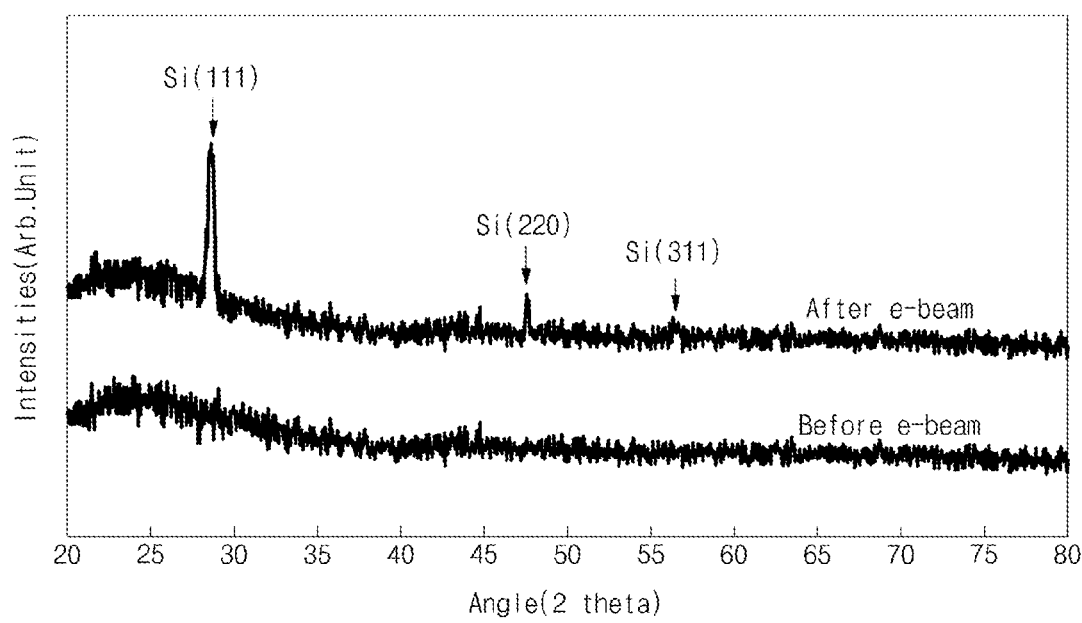
FIG. 6 is a graph illustrating X-ray diffraction (XRD) results according to electron beam irradiation.

FIG. 6 is a graph illustrating X-ray diffraction (XRD) results according to the linear electron beam irradiation. Herein, an X-axis represents an angle and a Y-axis represents intensity.

As illustrated in FIG. 6, crystallinity in the XRD results overall appears weak due to small thicknesses of the amorphous silicon layers 220a and 230a. However, it may be observed that the amorphous silicon layers 220a and 230a grow along the Si(111) direction and the crystallinity gradually increases over time. In addition, a polycrystalline silicon peak in another direction is not observed.

Figure 7:
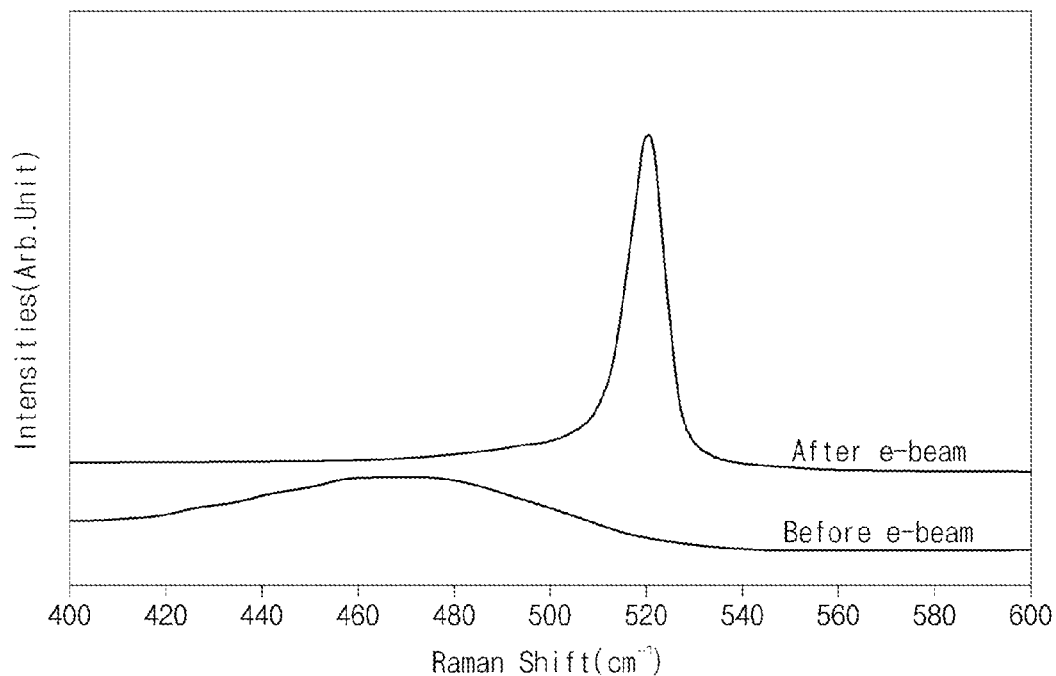
FIG. 7 is a graph illustrating degree of crystallization by Raman spectroscopy according to before and after the electron beam irradiation.

FIG. 7 is a graph illustrating degree of crystallization by Raman spectroscopy according to the linear electron beam irradiation. Herein, a Y-axis represents intensity of the linear electron beam and an X-axis represents a Raman shift according to the intensity of the linear electron beam.

As illustrated in FIG. 7, when examining the results of Raman analysis on the degree of crystallization of the amorphous silicon layer which is crystallized by the linear electron beam in the method of manufacturing a polycrystalline silicon thin film solar cell of the present disclosure, a peak was observed at 470 cm−1 before the crystallization of the amorphous silicon layer and a peak was observed at 520 cm−1 after the crystallization. That is, it may be understood that the degree of crystallization (i.e., crystallization peak value) of the amorphous silicon layer, which is crystallized by the linear electron beam, is significantly increased at 520 cm−1 in comparison to 470 cm−1.

Figure 8:
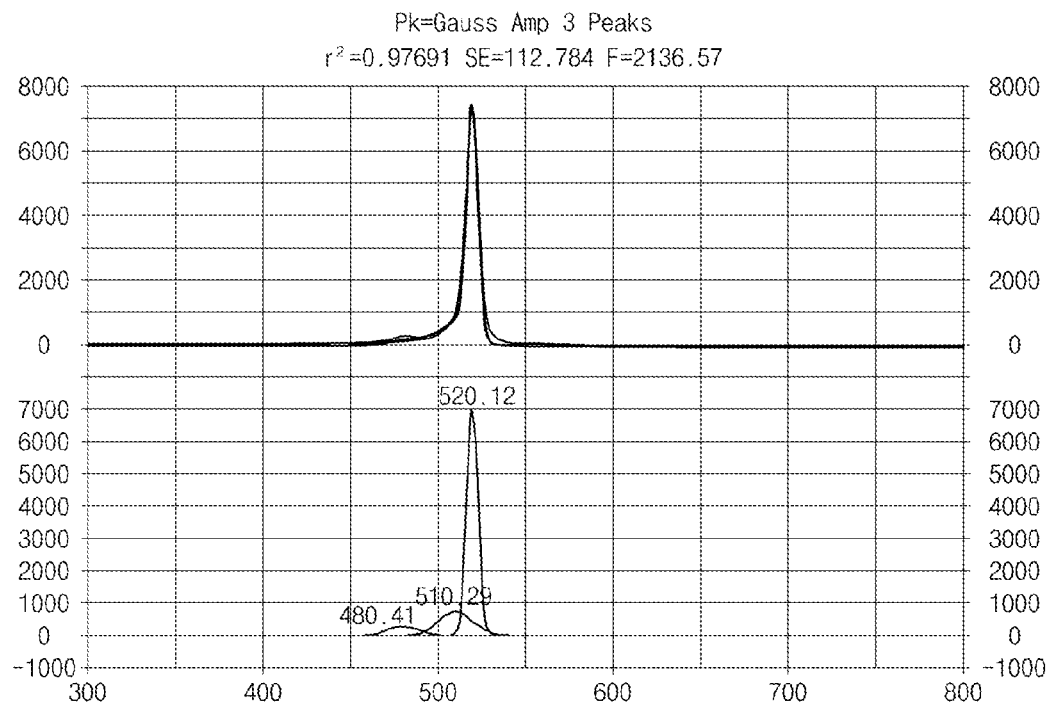
FIG. 8 illustrates peak fit analysis for the calculation of a crystallization fraction according to the electron beam irradiation.

FIG. 8 illustrates peak fit analysis for the calculation of a crystallization fraction according to the linear electron beam irradiation.

As illustrated in FIG. 8, as a result of calculating the crystallization fraction according to the linear electron beam irradiation by peak fit analysis, the crystallization fraction was about 96.5% or more as in the following Equation 1.

$$R_C = \frac{I_{510cm-1} + I_{520cm-1}}{I_{510cm-1} + I_{520cm-1} + I_{480cm-1}} = \frac{752.631579 + 7052.63158}{752.631579 + 7052.63158 + 278.947368} \equiv 0.96549 \quad \text{[Equation 1]}$$

where Rc represents a crystallization faction and Ix represents a crystallization peak value at wavelength x.

Figure 9:
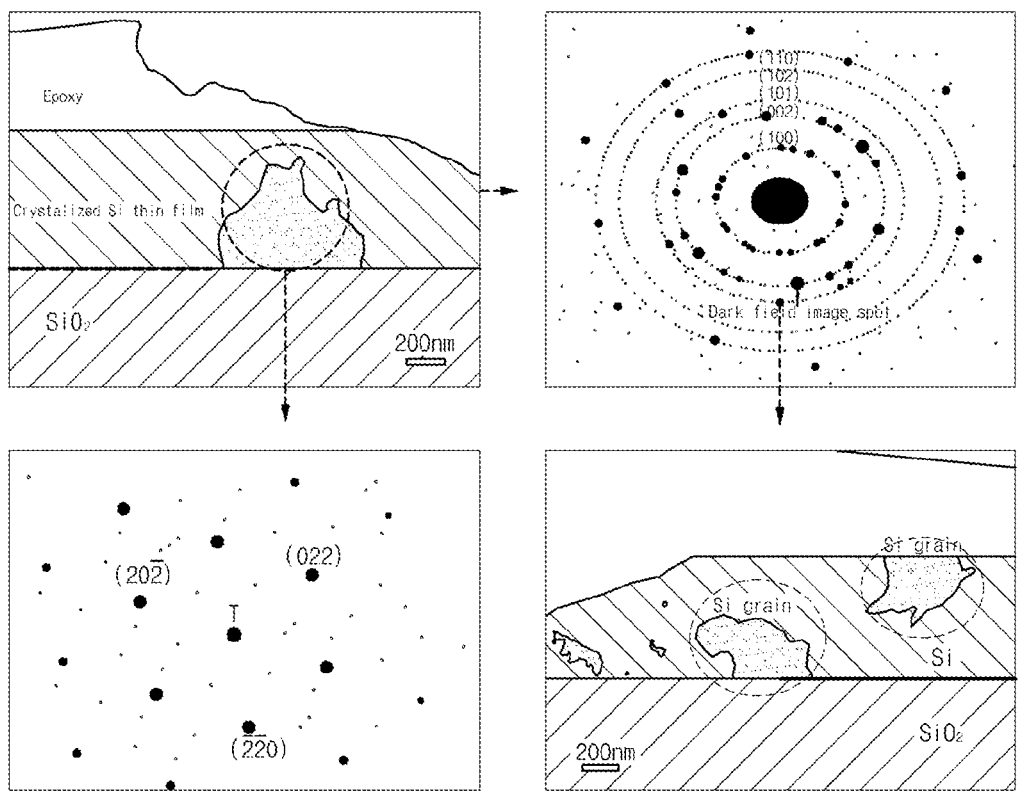
FIG. 9 is transmission electron microscope (TEM) images of a portion which is crystallized by the electron beam irradiation.

FIG. 9 is transmission electron microscope (TEM) images of a portion which is crystallized by the linear electron beam irradiation.

As illustrated in FIG. 9, when examining the results of TEM analysis on the portion which is crystallized by the linear electron beam irradiation, it may be confirmed that grains having a diameter of 200 nm were formed.

Figure 10:
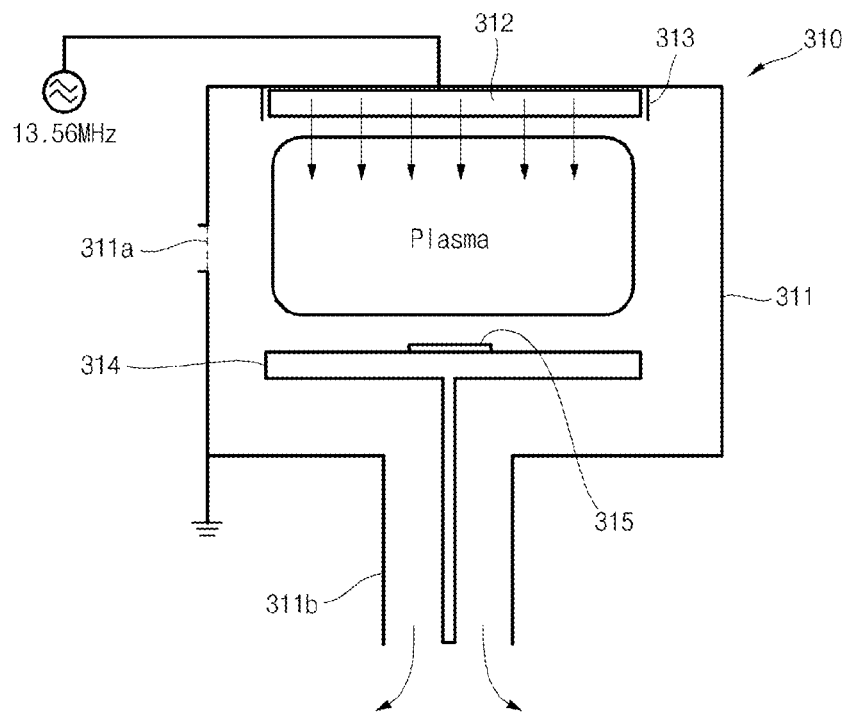
FIG. 10 illustrates a schematic configuration of a plasma enhanced chemical vapor deposition apparatus used in a method of crystallizing a large-area hydrogenated amorphous silicon thin film, which is formed by a plasma enhanced chemical vapor deposition method, using a linear electron beam according to another embodiment of the present disclosure.
Figure 11A:
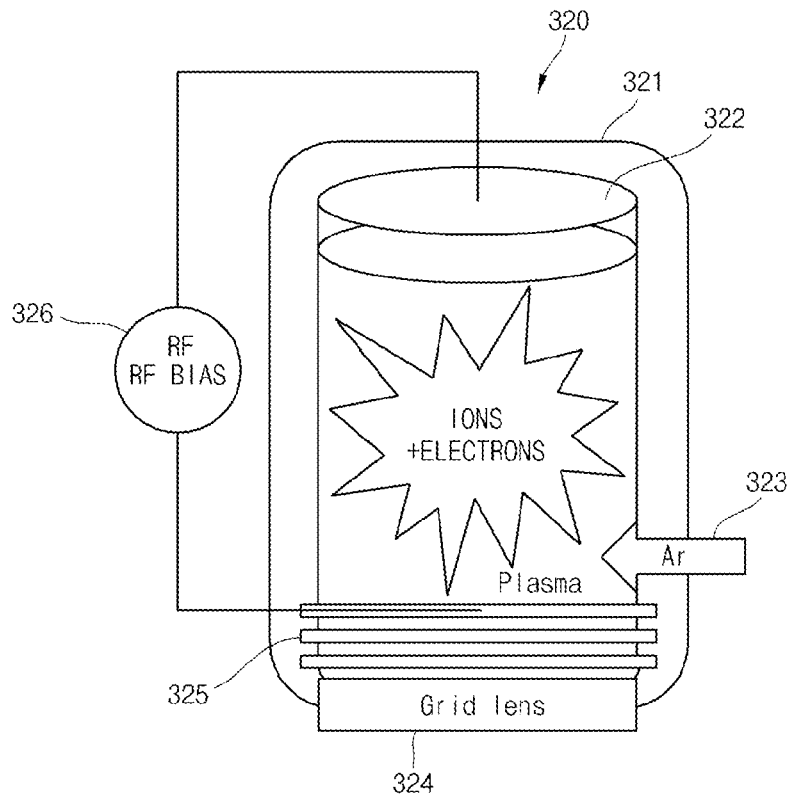
FIGS. 11A and 11B illustrate a schematic configuration of an electron beam irradiation apparatus used in a method of crystallizing a large-area hydrogenated amorphous silicon thin film, which is formed by a plasma enhanced chemical vapor deposition method, using a linear electron beam according to another embodiment of the present disclosure.
Figure 11B:
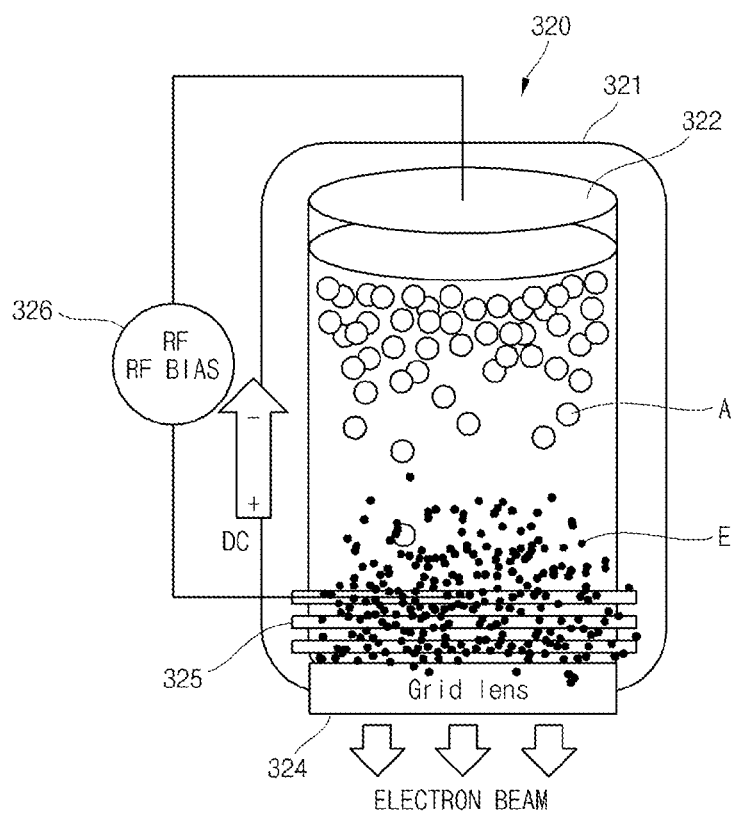

FIG. 10 illustrates a schematic configuration of a plasma enhanced chemical vapor deposition apparatus used in a method of crystallizing a large-area hydrogenated amorphous silicon thin film, which is formed by a plasma enhanced chemical vapor deposition method, using a linear electron beam according to another embodiment of the present disclosure, and FIGS. 11A and 11B illustrate a schematic configuration of an electron beam irradiation apparatus used in a method of crystallizing a large-area hydrogenated amorphous silicon thin film, which is formed by a plasma enhanced chemical vapor deposition method, using a linear electron beam according to another embodiment of the present disclosure.

As illustrated in FIG. 10, a plasma enhanced chemical vapor deposition (PECVD) apparatus 310 used in the method of crystallizing a large-area hydrogenated amorphous silicon thin film, which is formed by a plasma enhanced chemical vapor deposition method, using a linear electron beam according to the another embodiment of the present disclosure may include a chamber 311, a top electrode 312, a shower head 313, and a susceptor 314.

The chamber 311 includes a vent 311b.

The chamber 311 functions to maintain the inside of the chamber 311 in a vacuum state by spatially separating the inside and the outside of the chamber 311.

The top electrode 312 is included at a top end of the chamber 311.

The top electrode 312 functions to generate a high-density plasma in the chamber 311 by using power which is supplied from a power supply. In particular, the power supply applies 13.5 MHz RF power to the top electrode 312 to generate the high-density plasma in the chamber 311.

The vent 311b is connected to a vacuum pump (not shown) to exhaust gas from the inside of the chamber 311, and thus, the vent 311b may function to vent or maintain a predetermined vacuum state in the chamber 311.

The shower head 313 functions to uniformly supply gas into the chamber 311 by receiving the gas from a gas supply unit (not shown) which is provided at the outside of the chamber 311.

The susceptor 314 functions to support a substrate 315.

Although it is not illustrated in detail in FIG. 10, the scepter 314 may also include a heating member for heating the substrate 315 to a predetermined temperature or a cooling member for cooling the substrate 315 on the inside or the outside thereof.

The susceptor 314 is allowed to be provided at a position at which a spacing between the substrate 315 and the shower head 313 is constant, for example, 23 cm.

As illustrated in FIGS. 11A and 11B, an electron beam irradiation apparatus 320 used in the method of crystallizing a large-area hydrogenated amorphous silicon thin film, which is formed by a plasma enhanced chemical vapor deposition method, using a linear electron beam according to the another embodiment of the present disclosure may include a chamber 321, a top electrode 322, a gas inlet 323, a grid lens 324, an antenna 325, and a power supply 326. FIG. 11A illustrates a state in which a high-density plasma is formed in the electron beam irradiation apparatus, and FIG. 11B illustrates a state in which an electron beam is generated by the high-density plasma formed.

The chamber 321 functions to maintain the inside of the chamber 321 in a vacuum state by spatially separating the inside and the outside of the chamber 321 and includes a substrate (not shown) on which a silicon layer to be irradiated with an electron beam is formed.

The top electrode 322 is included at a top end of the chamber 321 to generate a high-density plasma in the chamber 321 by using power (e.g., RF bias) which is supplied from the power supply 326. In the chamber 321, argon gas, which is introduced form the gas inlet 323, is separated into argon ions A and electrons E by the high-density plasma.

The antenna 325 generates an electron beam that is only composed of the electrons E among the argon ions A and the electrons E which are separated in the chamber 321.

The electron beam thus generated is irradiated on an amorphous silicon layer (not shown), which is formed on the substrate, by the grid lens 324 to crystallize the amorphous silicon layer.

FIG. 12 is a flowchart illustrating a method of crystallizing a large-area hydrogenated amorphous silicon thin film, which is formed by a plasma enhanced chemical vapor deposition method, using a linear electron beam according to another embodiment of the present disclosure.

As illustrated in FIG. 12, the method of crystallizing a large-area hydrogenated amorphous silicon thin film, which is formed by a plasma enhanced chemical vapor deposition method, using a linear electron beam according to the another embodiment of the present disclosure may crystallize a hydrogenated amorphous silicon layer by irradiating the large-area hydrogenated amorphous silicon layer, which is formed on a substrate using the plasma enhanced chemical vapor deposition apparatus of FIG. 10, with a linear electron beam. For this, the present crystallization method may include a substrate preparing step S101, a hydrogenated amorphous silicon layer forming step S201, and a polycrystalline silicon layer forming step S301.

The substrate preparing step S101, the hydrogenated amorphous silicon layer forming step S201, and the polycrystalline silicon layer forming step S301 are steps respectively corresponding to a substrate preparing step S100, a type 1+ hydrogenated amorphous silicon layer forming step S200 and a type 1 hydrogenated amorphous silicon layer forming step S300, and an absorption layer forming step S400, and this will be described in more detail in the descriptions related to FIGS. 14A to 14G.

FIG. 13 is a flowchart illustrating a method of manufacturing a polycrystalline silicon thin film solar cell which includes a method of crystallizing a large-area hydrogenated amorphous silicon thin film, which is formed by a plasma enhanced chemical vapor deposition method, using a linear electron beam according to another embodiment of the present disclosure.

As illustrated in FIG. 13, the method of manufacturing a polycrystalline silicon thin film solar cell which includes a method of crystallizing a large-area hydrogenated amorphous silicon thin film, which is formed by a plasma enhanced chemical vapor deposition method, using a linear electron beam according to the another embodiment of the present disclosure may include a substrate preparing step S100, a type 1+ hydrogenated amorphous silicon layer forming step S200, a type 1 hydrogenated amorphous silicon layer forming step S300, an absorption layer forming step S400, a type 2 hydrogenated amorphous silicon layer forming step S500, an emitter layer forming step S600, and an electrode forming step S700.

FIGS. 14A to 14G sequentially illustrate the method of manufacturing a polycrystalline silicon thin film solar cell which includes a method of crystallizing a large-area hydrogenated amorphous silicon thin film, which is formed by a plasma enhanced chemical vapor deposition method, using a linear electron beam according to the another embodiment of the present disclosure.

In the present embodiment, the expression "type 1" denotes a P-type and the expression "type 2" denotes an N-type. Conversely, the type 1 may denote an N-type, and the type 2 may denote a P-type.

Also, type 1 or type 2 marked with "+" denotes a degree to which a P-type or N-type dopant is doped, and it denotes that the type 1 or type 2 marked with "+" is doped with more dopants than type 1 or type 2 without the mark "+".

As illustrated in FIG. 14A, in the substrate preparing step S100, an approximately flat substrate is prepared. That is, such a substrate may be a low-cost substrate, e.g., a glass substrate or a metal foil. For example, in a case where the substrate 410 is formed of a glass substrate, Corning 1737F glass, in which a softening point, an annealing point, and a strain point, which directly affect processing, respectively are 975° C., 721° C., and 666° C. and are better than those of other glasses, may be used as the substrate 410.

Also, in a case where the substrate 410 is formed of a glass substrate, a second electrode layer (not shown) may be formed on the substrate 410. In this case, the second electrode layer may be formed of a conductive material such as aluminum.

Furthermore, in a case where the substrate 410 is formed of a metal foil substrate, an insulation layer (not shown) may be included between the substrate 410 and a type 1+ amorphous silicon layer 430 to insulate from the type 1+ amorphous silicon layer 430 that is disposed on the substrate 410. Hereinafter, in the present embodiment, that the substrate 410 is formed of a metal foil will be described as an example.

In addition, a cleaning process may be performed on the substrate 410. For example, ultrasonically cleaning the substrate 410 in an acetone solution, an IPA solution, and a methanol solution respectively for 10 minutes, then rinsing 5 times with DI water, and subsequently N2 blowing may be preformed.

Herein, a buffer layer 420 (oxide layer or nitride layer) may be formed on the substrate 410 in advance, and the buffer layer 420 functions to allow an amorphous silicon layer to be better deposited on the substrate 410 and to prevent the movement of contaminants from the substrate 410 to an amorphous silicon layer or a polycrystalline silicon layer. In some cases, the buffer layer 420 may not be formed.

Although not illustrated in FIG. 14A, a protective layer may be formed between the substrate 410 and the buffer layer 420 to prevent heat transfer from the buffer layer 420 to the substrate 410, and the protective layer may include SiO2. A method of forming the protective layer is not particularly limited, and for example, a sputter and an evaporator may be used.

Figure 14B:
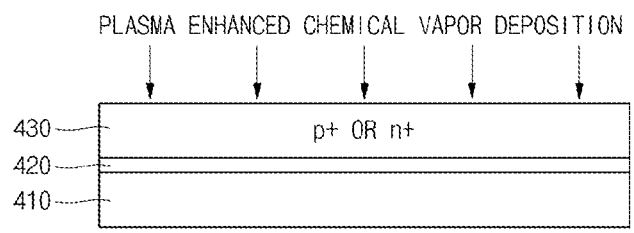
Figure 14C:
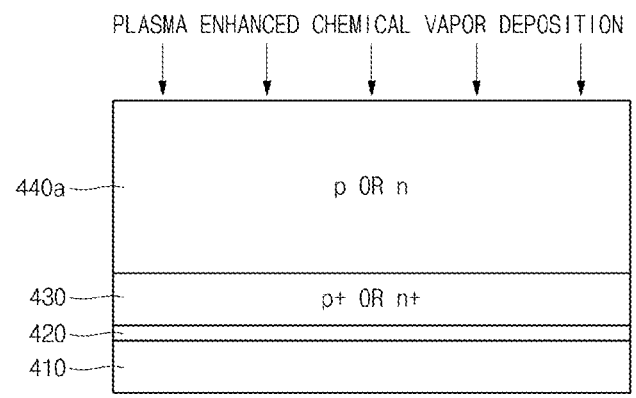

As illustrated in FIG. 14B, in the type 1+ hydrogenated amorphous silicon layer forming step S200, the type 1+ hydrogenated amorphous silicon layer 430 is deposited on the substrate 410 or the buffer layer 420 to a thickness of about 100 nm to about 350 nm in a vertical direction by PECVD. Herein, the type 1+ hydrogenated amorphous silicon layer 430 may be included as a boron-doped hydrogenated amorphous silicon layer, i.e., an a-Si:H layer. Also, the type 1+ hydrogenated amorphous silicon layer 430 may be included as a boron-doped hydrogenated microcrystalline silicon layer, i.e., a μc-Si:H layer. The type 1+ hydrogenated amorphous silicon layer 430 may be formed by a plasma enhanced chemical vapor deposition method using the PECVD apparatus which is described with reference to FIG. 10. The type 1+ hydrogenated amorphous silicon layer 430 may be formed on the substrate 410 by a plasma method in which silicon ions are generated by ionizing silane (SiH$_4$) gas, as a precursor of silicon, with a plasma and the substrate is then irradiated with the silicon ions. The type 1+ hydrogenated amorphous silicon layer 430 is doped with type 1 in a high concentration and subsequently crystallized to function as a back surface field As illustrated in FIG. 14C, in the type 1 hydrogenated amorphous silicon layer forming step S300, a type 1 hydrogenated amorphous silicon layer 440a is deposited on the type 1+ hydrogenated amorphous silicon layer 430. That is, the type 1 hydrogenated amorphous silicon layer 440a is deposited on the type 1+ hydrogenated amorphous silicon layer 430 to a thickness of about 2 μm in a vertical direction by a plasma enhanced chemical vapor deposition method using a PECVD apparatus. Herein, the type 1 hydrogenated amorphous silicon layer 440a may be included as a boron-doped hydrogenated amorphous silicon layer, i.e., an a-Si:H layer. Also, the type 1 hydrogenated amorphous silicon layer 440a may be included as a boron-doped hydrogenated microcrystalline silicon layer, i.e., a μc-Si:H layer. The type 1 hydrogenated amorphous silicon layer 440a may be formed by using the PECVD apparatus which is described with reference to FIG. 10. The type 1 hydrogenated amorphous silicon layer 440a may be formed on the type 1+ hydrogenated amorphous silicon layer 430 by a plasma method in which silicon ions are generated by ionizing silane (SiH$_4$) gas, as a precursor of silicon, with a plasma, and the type 1+ hydrogenated amorphous silicon layer 430 is then irradiated with the silicon ions. Also, the type 1 hydrogenated amorphous silicon layer 440a may be formed under processing conditions including a process pressure of 100 mtorr to 500 mtorr, a process power of 25 W to 100 W, and a process temperature of 150° C. to 300° C. In the present disclosure, doping concentrations of boron in the type 1+ hydrogenated amorphous silicon layer 430 and the type 1 hydrogenated amorphous silicon layer 440a may be variously controlled by the plasma enhanced chemical vapor deposition method using the PECVD apparatus, and accordingly, the type 1+ hydrogenated amorphous silicon layer 430 and the type 1 hydrogenated amorphous silicon layer 440a may be formed as high-quality microcrystalline or polycrystalline silicon layers.

Figure 14D:
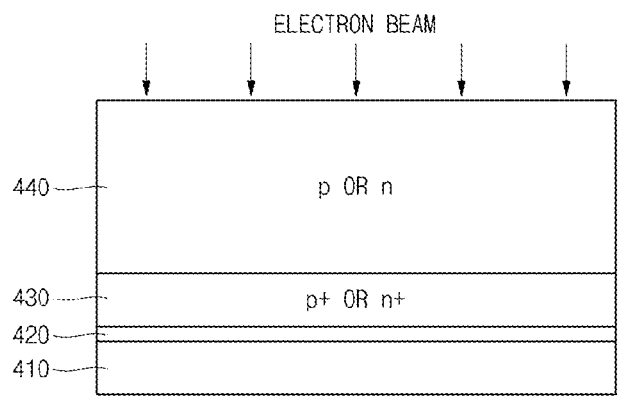

As illustrated in FIG. 14D, in the absorption layer forming step S400, an absorption layer 440 is formed by crystallizing the type 1+ hydrogenated amorphous silicon layer 430 and the type 1 hydrogenated amorphous silicon layer 440a into polycrystalline silicon by irradiating the type 1 hydrogenated amorphous silicon layer 440a with a linear electron beam. The absorption layer 440 may be formed by using the electron beam irradiation apparatus which is described with reference to FIGS. 11A and 11B. The linear electron beam is not obtained by accelerating thermal electrons, which are conventionally generated by applying a current to a filament, by a magnetic field. That is, argon gas is separated into argon ions and electrons by the formation of a high-density plasma, and the electron beam is composed of only the electrons among the separated argon ions and electrons.

Herein, with respect to the electron beam obtained from thermal electrons, as electrons generated by applying a current to a filament such as tungsten, the concentration or number of electrons may vary according to the degradation of the filament and a high-density electron cluster may be difficult to be obtained. However, as a method of using a plasma, a capacitively coupled plasma (CCP) or an inductively coupled plasma (ICP) is to obtain an electron beam by separating inert gas, such as argon, into argon ions and electrons using an electric field, wherein a high-density electron concentration obtained by the ICP is about 100 times higher than that by the CCP. Thus, an electron beam obtained from the ICP, for example, is used in which the periodic replacement time thereof is longer than that of the case of using thermal electrons from the filament and the intensity of the electron beam may be easily adjusted by forming a high-density electron concentration.

Furthermore, since the linear electron beam may be operated in a linear scan mode by using a grid lens instead of a spot-scanning mode, the linear electron beam may rapidly scan the type 1 hydrogenated amorphous silicon layer 440a at a rate of about 10 cm/min.

Therefore, the linear electron beam irradiation method according to the present embodiment is suitable for manufacturing a polycrystalline silicon solar cell.

In a case where the type 1 hydrogenated amorphous silicon layer 440a is deposited by PECVD in the type 1 hydrogenated amorphous silicon layer forming step S300, it is appropriate for the linear electron beam to have an energy of 1.5 keV to 5 keV. In the case that the energy of the linear electron beam is less than 1.5 keV, the crystallization rate and the crystallization fraction may be relatively low, and in the case in which the energy of the linear electron beam is greater than 5 keV, a surface of the type 1 hydrogenated amorphous silicon layer 440a may be removed by etching. In this case, an irradiation time of the linear electron beam may be in a range of 30 seconds to 120 seconds.

Figure 14E:
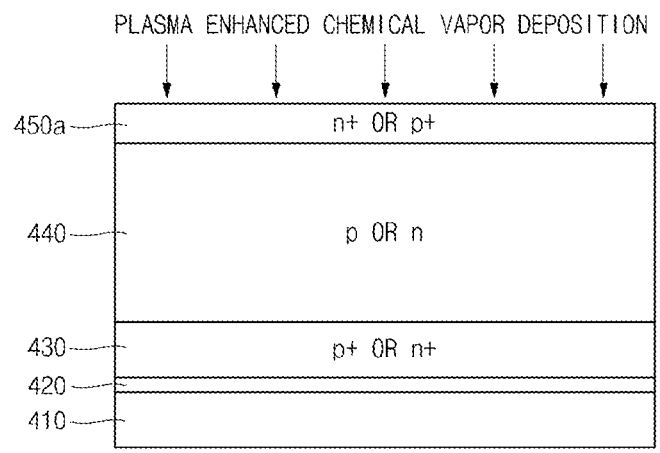

As illustrated in FIG. 14E, in the type 2 hydrogenated amorphous silicon layer forming step S500, a type 2 hydrogenated amorphous silicon layer 450a having a thickness of about 100 nm to about 200 nm in a direction perpendicular to the crystallized absorption layer 440 is deposited in the same manner as described above. That is, the type 2 hydrogenated amorphous silicon layer 450a having a conductive type opposite to that of the type 1+ hydrogenated amorphous silicon layer 430 and the type 1 hydrogenated amorphous silicon layer 440a is deposited on the absorption layer 440 by PECVD. The type 2 hydrogenated amorphous silicon layer 450a may be formed of a hydrogenated amorphous silicon carbide layer doped with type 2 impurity, i.e., a type 2 a-SiC:H layer. Also, the type 2 hydrogenated amorphous silicon layer 450a may be formed of a hydrogenated amorphous silicon layer doped with type 2 impurity, i.e., a P a-Si:H layer.

Figure 14F:
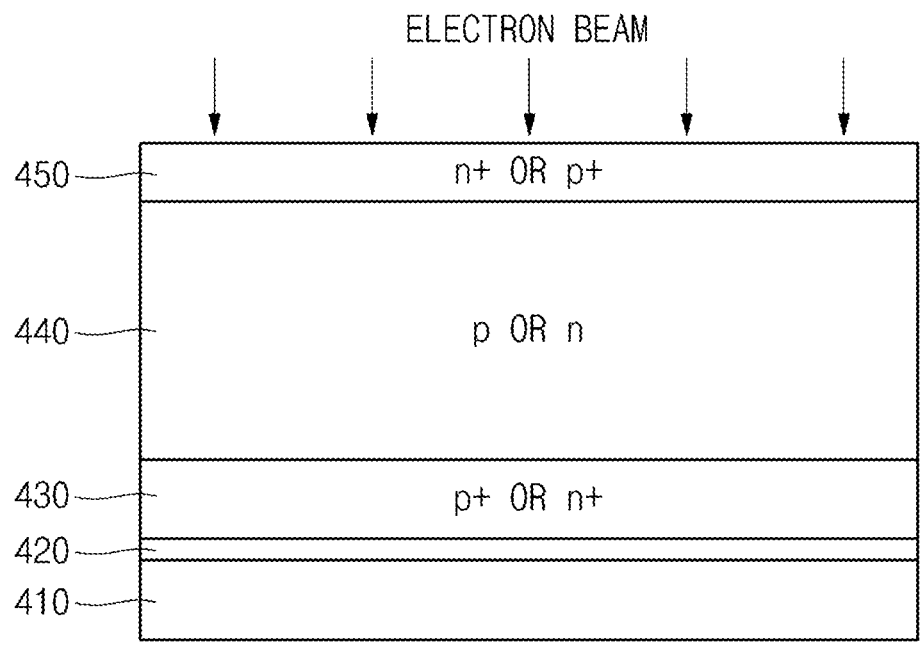

As illustrated in FIG. 14F, in the emitter layer forming step S600, an emitter layer 450 is formed by crystallizing the type 2 hydrogenated amorphous silicon layer 450a into polycrystalline silicon by irradiating the type 2 hydrogenated amorphous silicon layer 450a with a linear electron beam. As described above, argon gas is separated into argon ions and electrons by the formation of a high-density plasma, and the linear electron beam may be composed of only the electrons among the separated argon ions and electrons. In addition, since the linear electron beam may be operated in a linear scan mode by using a grid lens instead of a spot-scanning mode, the linear electron beam may rapidly scan the type 2 hydrogenated amorphous silicon layer 450a at a rate of about 10 cm/min.

Thus, the linear electron beam irradiation method according to the present embodiment is suitable for obtaining a large-area polycrystalline silicon solar cell.

In a case where the type 2 hydrogenated amorphous silicon layer 450a is deposited by PECVD in the type 2 hydrogenated amorphous silicon layer forming step S500, it is appropriate for the linear electron beam to have an energy of 1.5 keV to 5 keV. In the case that the energy of the linear electron beam is less than 1.5 keV, the crystallization rate and crystallization fraction may be relatively low, and in the case in which the energy of the linear electron beam is greater than 5 keV, a surface of the type 2 hydrogenated amorphous silicon layer 450a may be removed by etching. In this case, the irradiation time of the linear electron beam may be in a range of 30 seconds to 120 seconds.

Figure 14G:
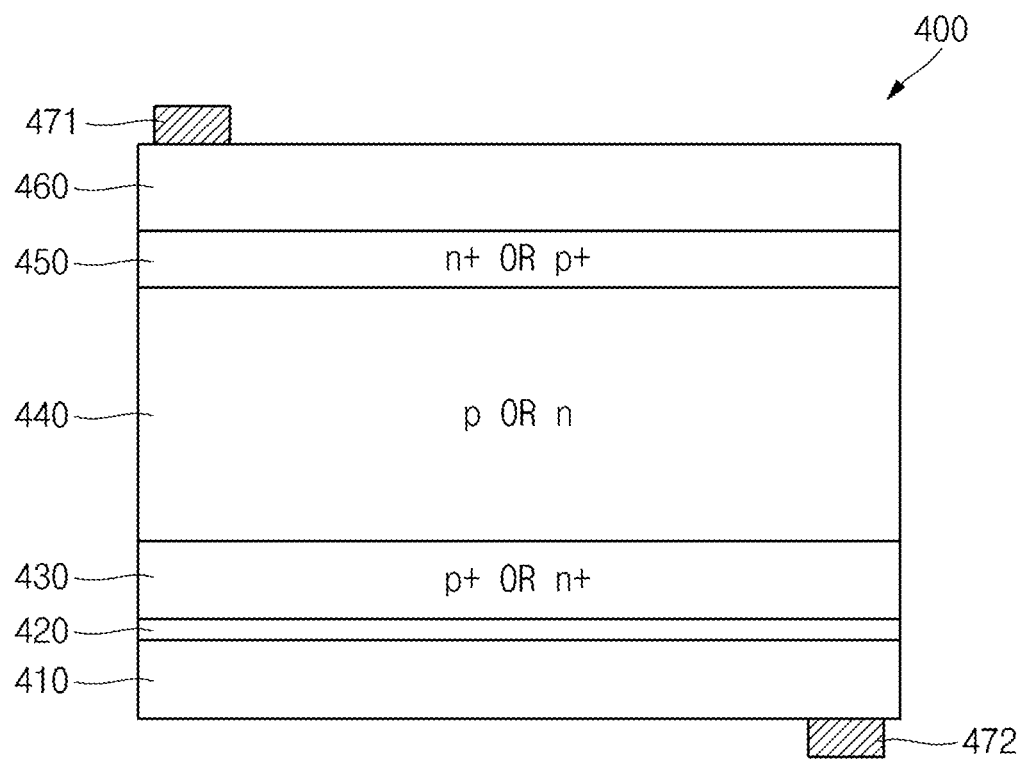

As illustrated in FIG. 14G, in the electrode forming step S700, a polycrystalline silicon solar cell is completed by forming a front electrode 471 to be in contact with a portion of the emitter layer 450 and forming a rear electrode 472 to be in contact with the substrate 410. Herein, a transparent conductive layer 460 or an anti-reflective layer (not shown) may be further formed on the emitter layer 450.

Figure 15:
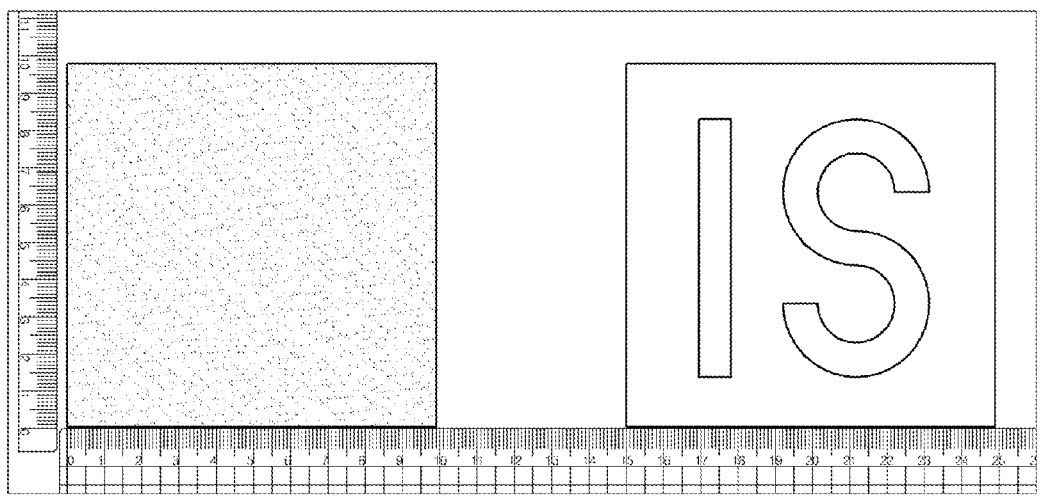
FIG. 15 is an image illustrating silicon thin films before and after crystallization by a linear electron beam which is used in the method of manufacturing a polycrystalline silicon thin film solar cell by a method of crystallizing a large-area amorphous silicon thin film using a linear electron beam according to the embodiment of the present disclosure.

FIG. 15 is an image illustrating silicon thin films before and after crystallization by a linear electron beam which is used in the method of manufacturing a polycrystalline silicon thin film solar cell by a method of crystallizing a large-area amorphous silicon thin film using a linear electron beam according to the embodiment of the present disclosure. In FIG. 15, after disposing a predetermined character (e.g., "IS") on a rear surface of an amorphous silicon thin film, images taken from the front side of the amorphous silicon thin film before and after the crystallization of the amorphous silicon thin film are respectively arranged on the left and right side.

Referring to FIG. 15, the silicon thin film before the crystallization by the linear electron beam is in an opaque state in which the character disposed on the rear surface is invisible, because light is not transmitted through the silicon thin film. In contrast, it may be understood that the silicon thin film after the crystallization by the linear electron beam is in a transparent state in which the character disposed on the rear surface is clearly visible, because the light is transmitted through the silicon thin film.

The above descriptions are merely exemplary embodiments for implementing the method of manufacturing a polycrystalline silicon thin film solar cell by a method of crystallizing a large-area amorphous silicon thin film using a linear electron beam according to the present disclosure, so that the present disclosure is not limited thereto. The true scope of the present disclosure should be defined to the extent that those skilled in the art can make various modifications and changes thereto without departing from the scope of the disclosure, as defined by the appended claims.

The invention claimed is:

1. A method of manufacturing a polycrystalline silicon thin film solar cell by a method of crystallizing a large-area amorphous silicon thin film using a linear electron beam, the method of manufacturing a polycrystalline silicon thin film solar cell comprising:
   preparing a substrate;
   depositing a type 1+ amorphous silicon layer in which the type 1+ amorphous silicon layer is formed on the substrate;
   depositing a type 1 amorphous silicon layer in which the type 1 amorphous silicon layer is formed on the type 1+ amorphous silicon layer;
   forming an absorption layer in which the absorption layer is formed by crystallizing the type 1 amorphous silicon layer and the type 1+ amorphous silicon layer by irradiating the type 1 amorphous silicon layer with a linear electron beam;
   depositing a type 2 amorphous silicon layer in which the type 2 amorphous silicon layer is formed on the absorption layer; and
   forming an emitter layer in which the emitter layer is formed by crystallizing the type 2 amorphous silicon layer by irradiating the type 2 amorphous silicon layer with a linear electron beam,
   wherein the linear electron beam is irradiated in a linear scan mode in which the linear electron beam is reciprocated within a predetermined distance on the type 1 and type 2 amorphous silicon layers.

2. The method of manufacturing a polycrystalline silicon thin film solar cell of claim 1, wherein, in the preparing of the substrate, the substrate is a glass substrate or a metal foil.

3. The method of manufacturing a polycrystalline silicon thin film solar cell of claim 1, wherein the type 1 and type 2 amorphous silicon layers are formed by plasma enhanced chemical vapor deposition (PECVD).

4. The method of manufacturing a polycrystalline silicon thin film solar cell of claim 3, wherein the linear electron beam has an energy of 1.5 keV to 5 keV and an irradiation time of 30 seconds to 120 seconds.

5. The method of manufacturing a polycrystalline silicon thin film solar cell of claim 3, wherein, in the forming of the absorption layer and the forming of the emitter layer, a process pressure is $3 \times 10^{-4}$ torr and a process time is 25 seconds to 200 seconds.

6. The method of manufacturing a polycrystalline silicon thin film solar of claim 3, wherein the type 1+ amorphous silicon layer is formed to a thickness of 200 nm, and the type 1 amorphous silicon layer is formed to a thickness of 1 μm to 1.5 μm.

7. The method of manufacturing a polycrystalline silicon thin film solar cell of claim 3, wherein the type 2 amorphous silicon layer is formed to a thickness of 100 nm.

8. The method of manufacturing a polycrystalline silicon thin film solar cell of claim 3, wherein a grain size along a direction horizontal to the absorption layer is 200 nm.

9. The method of manufacturing a polycrystalline silicon thin film solar cell of claim 3, wherein the linear electron beam comprises electrons that are separated from argon ions by a plasma generated from argon gas which is injected at 50 sccm.

10. A method of manufacturing a polycrystalline silicon thin film solar cell by a method of crystallizing a large-area amorphous silicon thin film using a linear electron beam, the method of manufacturing a polycrystalline silicon thin film solar cell comprising:
preparing a substrate;
depositing a type 1+ amorphous silicon layer in which the type 1+ amorphous silicon layer is formed on the substrate;
depositing a type 1 amorphous silicon layer in which the type 1 amorphous silicon layer is formed on the type 1+ amorphous silicon layer;
forming an absorption layer in which the absorption layer is formed by crystallizing the type 1 amorphous silicon layer and the type 1+ amorphous silicon layer by irradiating the type 1 amorphous silicon layer with a linear electron beam;
depositing a type 2 amorphous silicon layer in which the type 2 amorphous silicon layer is formed on the absorption layer; and
forming an emitter layer in which the emitter layer is formed by crystallizing the type 2 amorphous silicon layer by irradiating the type 2 amorphous silicon layer with a linear electron beam.

11. The method of manufacturing a polycrystalline silicon thin film solar cell of claim 10, wherein, in the preparing of the substrate, the substrate is a glass substrate or a metal foil.

12. The method of manufacturing a polycrystalline silicon thin film solar cell of claim 10, wherein the type 1 and type 2 amorphous silicon layers are formed by plasma enhanced chemical vapor deposition (PECVD).

13. The method of manufacturing a polycrystalline silicon thin film solar cell of claim 12, wherein the linear electron beam has an energy of 1.5 keV to 5 keV and an irradiation time of 30 seconds to 120 seconds.

14. The method of manufacturing a polycrystalline silicon thin film solar cell of claim 12, wherein, in the forming of the absorption layer and the forming of the emitter layer, a process pressure is $3\times10^{-4}$ torr and a process time is 25 seconds to 200 seconds.

15. The method of manufacturing a polycrystalline silicon thin film solar of claim 12, wherein the type 1+ amorphous silicon layer is formed to a thickness of 200 nm, and the type 1 amorphous silicon layer is formed to a thickness of 1 μm to 1.5 μm.

16. The method of manufacturing a polycrystalline silicon thin film solar cell of claim 12, wherein the type 2 amorphous silicon layer is formed to a thickness of 100 nm.

17. The method of manufacturing a polycrystalline silicon thin film solar cell of claim 12, wherein a grain size along a direction horizontal to the absorption layer is 200 nm.

18. The method of manufacturing a polycrystalline silicon thin film solar cell of claim 12, wherein the linear electron beam comprises electrons that are separated from argon ions by a plasma generated from argon gas which is injected at 50 sccm.

* * * * *